(12) United States Patent
Ushirogouchi et al.

(10) Patent No.: US 6,168,897 B1
(45) Date of Patent: Jan. 2, 2001

(54) METHOD OF FORMING PATTERNS

(75) Inventors: Toru Ushirogouchi, Kanagawa-ken; Makoto Nakase; Takuya Naito, both of Tokyo; Koji Asakawa, Kanagawa-ken, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/277,744

(22) Filed: Mar. 29, 1999

Related U.S. Application Data

(62) Division of application No. 08/462,546, filed on Jun. 5, 1995, now Pat. No. 5,938,841, which is a continuation of application No. 08/181,413, filed on Jan. 14, 1994, now abandoned.

(30) Foreign Application Priority Data

Jan. 14, 1993 (JP) ................................................ 5-004953

(51) Int. Cl.[7] ...................................................... G03F 7/00
(52) U.S. Cl. ............................................. 430/139; 430/322
(58) Field of Search ................................... 430/139, 311, 430/322

(56) References Cited

U.S. PATENT DOCUMENTS

| | | | |
|---|---|---|---|
| 4,413,052 | 11/1983 | Green et al. | 430/327 |
| 4,551,409 | 11/1985 | Gulla et al. | 430/325 |
| 5,248,582 | * 9/1993 | Uenishi | 430/192 |
| 5,286,602 | 2/1994 | Pawlowski et al. | 430/326 |
| 5,314,786 | 5/1994 | Roeschert et al. | 430/326 |
| 5,403,695 | 4/1995 | Hayase et al. | 430/326 |
| 5,753,352 | * 5/1998 | Vanmaele | 428/284 |
| 5,834,153 | * 10/1998 | Hasegawa | 430/139 |

FOREIGN PATENT DOCUMENTS

| | | |
|---|---|---|
| 271 969 | 9/1989 | (DE) . |
| 0 062 611 | 10/1982 | (EP) . |
| 1147272 | * 4/1969 | (GB) . |
| 58-111028 | 7/1983 | (JP) . |
| 59-148057 | 8/1984 | (JP) . |
| 63-74049 | 4/1988 | (JP) . |

\* cited by examiner

*Primary Examiner*—Kathleen Duda
(74) *Attorney, Agent, or Firm*—Oblon, Spivak, McClelland, Maier & Neustadt, P.C.

(57) ABSTRACT

Disclosed is a method of forming a pattern on a substrate, comprising a step of forming a light-sensitive layer containing an aromatic compound on a substrate, a step of patternwise exposing the light-sensitive layer with a light having a wavelength range shorter than the maximum wavelength in the third absorption band from the long-wave side in the absorption spectrum of the aromatic compound and longer than the maximum wavelength in the fourth absorption band from the same, thereby to cause a photochemical reaction in the light-sensitive layer, and a step of developing the exposed light-sensitive layer, optionally after heat-treating the layer, so as to selectively remove the exposed area of the layer or leave the area as it is. The method gives a pattern having a high resolving power and an excellent dry-etching resistance.

12 Claims, No Drawings

METHOD OF FORMING PATTERNS

This application is a Division of application Ser. No. 08/462,546 filed on Jun. 5, 1995, now U.S. Pat. No. 5,928,841, which is a continuation of Ser. No. 08/181,413 filed Jan. 14, 1994, abandoned.

BACKGROUND OF THE INVENTION

1. Field of the Invention

This invention relates to a method of forming patterns.

2. Description of the Related Art

In the field of electronic parts which need various fine workings, such as semiconductor integrated circuits, fine working technology including photolithography is employed. The technology is carried out, for example, in accordance with the following process.

First, a resist layer is formed on a semiconductor substrate, such as siliconwafer and the like, by a spin-coating method.

Next, the resist film is patternwise exposed to cause a photochemical reaction thereon, developed and rinsed to form a desired resist pattern.

Further, using the resist pattern as an etching resistant mask, the exposed area of the substrate is etched to form fine lines and spaces (i.e. open area).

Recently, in order to attain large-scale integration with elevation of the density of electronic parts, it has been required to form fine resist patterns of submicron orders. As one means of satisfying the request, a light source (ray source) of shortened wave length has been employed. For instance, a process of forming fine resist patterns by using an ArF excimer laser (having a wavelength of 193 nm) or fifth harmonic wave of YAG laser (having a wavelength of 213 nm) has been developed.

In the above-mentioned process, it is requested to form resist patterns having an excellent dry-etching resistance for the purpose of more effectively carrying out fine working of the desired patterns. Regarding the point, it is known that use of a light-sensitive composition containing a compound having aromatic ring(s) or an aromatic compound as a resist material is effective. As such a resist material, for example, there are mentioned a resistcomposition containing an alkali-soluble novolak resin and a light sensitive agent of quinone diazide, which is used in the current mass-production process of producing LSI, and a chemically amplifiable resist composition containing an alkali-soluble resin having phenolic nucleus/nuclei, a dissolution inhibitor and an optical acid-generating agent, which is disclosed in Japanese Patent disclosure No. 63-27829.

In conventional methods of forming patterns, exposure with the above-mentioned short-wave ultraviolet rays and the like, using a light-sensitive composition containing an aromatic compound as a resist material, for forming resist patterns having a high resolving power and an excellent dry-etching resistance has been attempted.

However, the above-mentioned resist material or a light-sensitive composition containing an aromatic compound especially has an extremely strong absorption of light within a short wavelength range (about 190 nm or so) since the electrons of the aromatic ring in the compound are excited with the light. Therefore, in the process of forming patterns where the resist material (resist film) is exposed with a light source having the above-mentioned short-wave length lights, the material often has over-absorption of the light during exposure. Therefore, the photochemical reaction could not advance sufficiently through the resist film.

This phenomenon will be explained in more detail hereunder. It is known that the aromatic compound contained in the above-mentioned resist material generally has three absorption bands to be caused by the structure of the aromatic ring of the compound. Of them, the first and second absorption bands from the long-wave side are caused by the electronic excitation as generated by molecular vibration, which should not be generated from the intrinsic molecular symmetry, and therefore they are not so strong. On the other hand, the third absorption band is extremely strong. In the conventional methods of forming patterns, since the exposure is effected with ultraviolet rays or the like having a wavelength range near to the first and second absorption bands from the long-wave side or having a wavelength range further longer than these absorption bands, the above-mentioned resist film does not have any strong light absorption. However, where exposure with short-wave radiation rays or the like is employed, the above-mentioned resist film would probably have a strong light absorption due to the third absorption band of the above-mentioned aromatic compound. In particular, where the above-mentioned resist film is exposed with an ArF excimer laser the like, the light transmittance through the film is extremely small so that the intended photochemical reaction could not advance throughout the whole film. As a result, a resist pattern having a desired resolving power and also having an excellent dry-etching resistance could not be obtained, which is a problem.

The present invention has been made in view of the above-mentioned problems.

SUMMARY OF THE INVENTION

An object of the present invention is to provide a method of forming patterns by short-wave exposure, which is applicable to photolithography in a process of producing semiconductor devices and the like.

Another object of the present invention is to provide a method of stably forming a pattern having a high resolving power and an excellent dry-etching resistance.

The above-mentioned objects of the present invention have been attained by the following methods of forming patterns.

A method of forming a pattern on a substrate, comprising:

a step of depositing on the substrate a light-sensitive layer containing an aromatic compound including an aromatic ring with from 4 to 12 conjugated double bonds;

a step of Patternwise-exposing the light-sensitive layer with electromagnetic radiation having a wavelength range of approximately from 180 to 220 nm so as to cause a photochemical reaction in the light-sensitive layer; and a step of developing the exposed light-sensitive layer.

3. Detailed Description of the Preferred Embodiment

The method of the present invention comprises steps of depositing on the substrate a light-sensitive layer containing an aromatic compound having a aromatic ring with from 4 to 12 conjugated double bonds; patternwise-exposing the light-sensitive layer with electromagnetic radiation having a wavelength range of approximately from 180 to 220 nm so as to cause a photochemical reaction in the light-sensitive layer; and developing the exposed light-sensitive layer.

The "conjugated double bonds" as referred to herein means that plural double bonds are connected with each other each via one single bond and are located on a plane. The aromatic ring of the kind is generally cyclized to be a 6-membered ring.

Considering in practice, the method of the present invention includes the means for exposure and the constitution of the light-sensitive layer, or the components of constituting the light-sensitive composition to be used. In a method practiced in accordance with the present invention, an ultraviolet ray having a defined wavelength range (approximately from 180 to 220 nm) are used so as to obtain a pattern having high resolving power. For example, an ArF excimer laser (193 nm) or a fifth harmonic of a YAG laser (213 nm) is employed as a light source and, according to this, a light-sensitive layer containing a compound having aromatic ring(s) of a particular structure is used.

In general, if a structure has three or less conjugated double bonds, for example a benzene ring, the absorption region of the structure will be near 180 to 220 nm. Accordingly, if a pattern is formed with ultraviolet rays having the above-mentioned wavelength range, the light transmittance through the light-sensitive layer (resist layer) is decreased when the layer includes benzene ring(s), so as to improve the etching resistance of the pattern. In that case, photochemical reaction by exposure the to rays could not sufficiently advance throughout the whole thickness of the layer.

According to a method practiced in accordance with the present invention, an aromatic compound with four or more conjugated double bonds is used so as to shift the absorption band of the compound to a longer-wavelength. Therefore, an absorption by the compound in wavelenght range of 180 to 220 nm will be reduced. As a result, the light transmittance through the light-sensitive layer during exposure is elevated and the photochemical reaction thereby advances sufficiently throughout the whole layer in its thickness direction. Finally both a high resolution and an excellent dry-etching resistance can be achieved by the characteristics of the aromatic compounds.

In the method as mentioned above, the structure of the aromatic ring(s) in the aromatic compound contained in the light-sensitive layer is suitably selected in accordance with the ultraviolet rays with a defined wavelength range for exposure. That is, an overlap of the respective wavelength ranges of the exposure rays and the absorption band of the aromatic compound contained in the light-sensitive layer should be avoided in order to improve the light transmittance through the light-sensitive layer and obtain an intended fine pattern.

Next, the above-mentioned method is explained in detail in order of the successive steps.

In the first step, a solution (varnish) of a light-sensitive composition containing, an aromatic compound having an aromatic ring with from 4 to 12 conjugated double bonds in the structure, is coated on a substrate, for example, by using a spin coating method or a dip coating method. Then it is dried at a temperature of approximately from 60° C. to 150° C., preferably approximately 80° C. to 130° C., to a light-sensitive layer (resist film).

As the substrate, for example, usable are a silicon wafer, a silicon wafer having thereon various insulating films, electrodes or electric wires, a blank mask, a semiconductor wafer of III–V compounds such as GaAs, and the like.

On the other hand, the above-mentioned light-sensitive composition is resist material, including at least one aromatic compound having a aromatic ring with from 4 to 12 conjugated double bonds as a main component or other component of the resist material.

The aromatic compound having aromatic ring(s) with from 4 to 12 conjugated double bonds used in practicing the method of the present invention are compounds of which the particular aromatic ring(s) can be been introduced into the molecular skeletons, for example, into the main chain skeleton and/or side chain skeleton. Examples of a light-sensitive composition include positive resist containing a compound having a main chain of which is cut by exposure, or compound whose solubility is elevated by exposure; and negative resist containing containing compound having a main chain of which is cut by exposure, or compound whose solubility is lowered by exposure. Of them, useful is a chemically amplifiable resist in which the photochemical reaction is amplified by thermal reaction after the exposure thereto.

The above-mentioned aromatic ring with from 4 to 12 conjugated double bonds is, for example, a ring having a skeleton of a benzene ring, a pyridine ring or the like in which one or more atoms of bonding to the skeleton ring are bonded to other atom(s) via double bond(s). Specific examples of the ring include benzene ring skeletons, pyridine ring skeletons or the like as substituted by unit(s) of —$R_1$=$R_2$— or

(where $R_1$ and $R_2$ each represents a mono-substituted carbon atom or nitrogen atom; $R_3$ represents a carbon atom; and $R_4$ represents oxygen atom or a mono-substituted nitrogen atom or a di-substituted carbon atom).

The above-mentioned aromatic rings may also be condensed rings (i.e., heterocyclic rings) composed of the above-mentioned benzene ring, pyridine ring and other mono-cyclic rings, as they have an excellent plane property. Examples of the heterocyclic rings include pyrrole, benzofuran, benzothiophene, indole, benzoxazole, benzothiazole, indazole, chromene, quinoline, cinnoline, phthalazine, quinazoline, dibenzofuran, carbazole, acridine, phenanthoridine, phenanthroline, phenazine, thianthrene, indolidine, naphthyridine, purine, puteridine, fluorene, benzoquinone, phthalimide, phthalic acid anhydride skeleton and the like.

The above-mentioned aromatic ring having from 4 to 12 conjugated double bonds is preferably a condensed ring composed of 6-membered rings, since the patterns to be formed may have an extremely improved dry-etching resistance. Examples of the condensed ring include naphthalene, anthracene, phenanthrene, pyrene, naphthacene, chrysene, 3,4-benzophenanthrene, perylene, pentacene and picene. In addition, biphenylene and biphenyl are also preferred structures, as they give an excellent dry-etching resistance. In particular, where the aromatic ring is selected from naphthalene, anthracene and phenanthrene, the transparency and dry-etching resistance of the pattern to be formed are finally elevated.

In the above-mentioned method, it is preferred that the proportion of the aromatic rings having from 4 to 12 conjugated double bonds is about 60% by weight or more of all the aromatic rings in the light-sensitive composition. The reason is because if it is less than about 60% by weight, the light transmittance of the light-sensitive layer is deteriorated. The proportion is more preferably within the range of about from 75 to 100% by weight. The proportion of the above-mentioned particular aromatic compound in the solid content of the light-sensitive composition is preferably from 10% by weight to less than 90% by weight. The reason is because if the content of the aromatic compound is less than 10% by weight, the dry-etching resistance of the pattern to be formed is decreased, but if it is 90% by weight or more, the light transmittance of the light-sensitive layer is decreased. The content of the aromatic compound is more preferably from about 20 to 50% by weight.

Where the above-mentioned aromatic ring is substituted by hydroxyl group(s) or protected hydroxyl group(s) such as $OR_5$ (where $R_5$ represents tert-butyl group or tert-butoxycarbonyl group), the compound containing the ring may be finally soluble in alkali substances after exposure thereto. Therefore, the compound is extremely suitable in the pattern-forming process using an alkali substance for development.

The light-sensitive composition (resist) including an aromatic compound having the above-mentioned particular aromatic ring(s) is desired to have a melting point of approximately 50° C. or higher, and it is desired to have a high solubility in coating solvents in view of the coatability thereof.

In the positive resists, negative resists and chemically amplifiable resists, aromatic ring(s) with from 4 to 12 conjugated double bonds have been introduced into the skeletons, which is for example, the skeleton of the main chain and/or side chain of the resin components, or the optical acid-generating agents and dissolution inhibitors.

Specific examples of the positive resist include a resin composition including a homopolymer or a copolymer of a vinyl or acrylic compound having aromatic ring(s) with 4 to 12 conjugated double bonds such as naphthalene ring, anthracene ring and the like in the side chain(s) and an acrylic compound such as methyl methacrylate, $\chi$-chloromethacrylate, trifluoroethyl $\chi$-chloroacrylate, trifluoromethyl acrylate, and the like; a resin composition including a light-sensitive compound such as polysilane having aromatic ring(s) such as naphthalene ring in the side chain(s); and a phenolic resin including a naphthoquinone diazide compound having aromatic ring(s) such as naphthalene ring and the like.

Specific examples of the negative resist include a copolymer of a vinyl or acrylic compound having aromatic ring(s) such as naphthalene ring, anthracene ring and the like in the side chain(s) and conventional polymerizable compounds, such as an acryl methacrylate, a methacrylate having epoxy group(s) in the side chain(s), maleic anhydride, sulfer dioxide ($SO_2$) lor an acrylic compound where the number of the carbon atoms in the ester side chain(s) is 4 or more; a resin composition including a light-sensitive compound such as polysiloxane having aromatic ring(s) such as naphthalene ring in the side chain(s); and a composition comprising a phenolic resin having aromatic ring(s), such as naphthol, and a photo-crosslinking agent.

The compositions may optionally include a sensitizing agent such as a bisazide compound or the like, if desired.

As specific examples of the above-mentioned chemically amplifiable resist, the following compounds are mentioned. The chemically amplifiable resist includes a compound capable of generating an acid or an alkali by exposure, (i.e., an optical acid-generating agent, optical alkali generating agent) and a compound having at least one bond capable of being decomposed by an acid or alkali.

Examples of a chemically amplifiable positive resist, include a resin composition including a resin component comprising a copolymer of a vinyl or acrylic compound having aromatic ring(s) with 4 to 12 conjugated double bonds in the side chain(s) and a compound having tert-butyl ester(s) such as tert-butyl methacrylate or tert-butoxycarbonyloxyvinylnaphthalene in the side chain(s) or an acrylic or vinyl compound having tert-butyl ester(s) in the side chain(s), and an optical acid-generating agent and optionally a compound having at least one bond capable of being decomposed by an acid (i.e., dissolution inhibitor). If the composition includes the dissolution inhibitor, the resin component will not need to include a tert-butyl ester, although they may used as a mixture. In that case, the resin may be a copolymer including as a component a vinyl compound having an alkali-soluble group such as methacrylic acid or the like which gives alkali-solubility to the copolymer.

Specific examples of the above-mentioned optical acid-generating agent include compounds such as sulfonyl compounds, sulfonate compounds, 4-quinone-diazide compounds, onium salts such as sulfonium salts, iodonium salts and the like.

Specific examples of the above-mentioned dissolution inhibitor include tert-butoxycarbonyl compounds, tert-butyl ester compounds, pyranyl ether compounds, trimethylsilyl protected OH or COOH compounds and the like. The optical acid-generating agent and the dissolution inhibitor may also have in the syructure an aromatic ring with 4 to 12 conjugated double bonds such as naphthalene ring or an anthracene ring in the structure, in accordance with the amount thereof to be in the resin composition.

The amounts of the individual components which comprise the above-mentioned positive chemically amplifiable resist are defined as follows: The amount of the acid generating agent contained in the resist is, though varying depending upon the strength of the acid to be generated therefrom, generally defined to fall within the range of approximately from 0.5 to 30% weight. If it oversteps the range, the sensitivity of the resist is decreased or the resolving power thereof is decreased. The amount of the dissolution inhibitor contained in the same is generally defined to fall within the range of approximately from 5 to 99% by weight. If it oversteps the range, the sensitivity of the resist is also decreased or the resolving power thereof is decreased, like the above.

On the other hand, examples of a chemically amplifiable negative resist include a resin composition including a a copolymer of a vinyl or acrylic compound having aromatic ring(s) with 4 to 12 conjugated double bonds in the side chain(s) and an alkali-soluble acrylic or vinyl compound such as acrylic acid, vinyl naphthol or the like, an optical acid generating agent, and a compound capable of crosslinking the polymer with an acid or an optical crosslinking agent.

Specific examples of the above-mentioned optical acid-generating agent include halogenated alkyl-substituted triazine and naphthyridine compounds, in addition to the compounds previously mentioned for the positive resist. Examples of the above-mentioned optical crosslinking agent include vinyl or acrylic copolymers having epoxy group(s) in the side chain(s) and also melamine compounds such as methylol-substituted N-containing heterocyclic compounds, such as triazine or naphthyridine and so on.

The amounts of the individual components which comprise the above-mentioned chemically amplifiable negative resist are defined as follows: The amount of the acid generating agent contained in the resist is, though varying depending upon the strength of the acid to be generated therefrom, generally defined to fall within the range of approximately from 0.5 to 30% by weight. The amount of the optical crosslinking agent contained in the same is preferably defined to fall within the range of approximately from 0.5% to 40% by weight. If they overstep the ranges, the sensitivity of the resist is decreased or the resolving power thereof is decreased.

The above-mentioned light-sensitive composistion may optionally include a surfactant as a film improving agent or a dye as a reflection inhibitor.

The light-sensitive composition may be prepared by dissolving the above-mentioned components and other additives in a suitable solvent followed by filtering the resulting solution. Examples of solvents usable for the dissolution include, for example, water ketone solvents such as cyclohexane, acetone, methyl ethyl ketone, methyl isobuty ketone and the like; cellosolve solvents such as methyl cellosolve, methyl cellosolve acetate, ethyl cellosolve, ethyl cellosolve acetate, butyl cellosolve, butyl cellosolve acetate and the like; ester solvents such as ethyl acetate, butyl acetate, isoamyl acetate, ethyl lactate, methyl lactate and the like; alcohol solvents such as 2-butanol, isoamyl alcohol, diethylene glycol and the like; polyalcohol derivative solvents such as ethylene glycol diethyl ether, diethylene glycol monoethyl ether, ethyl carbito and the like; and morpholine, N-methyl-2-pyrrolidone. These solvents may be used either singly or as a mixture of them.

A preferable example of the above mentioned light-sensitive composition (resist) including at least one aromatic compound having an aromatic ring with from 4 to 12 conjugated double bonds in the structure is a light-sensitive composition (A) shown below.

The light-sensitive composition (A) comprises:

(a) acetal resin having a unit represented by a following formula (1), and at least one unit selected from units represented by a following formulas (2), (3) and (4):

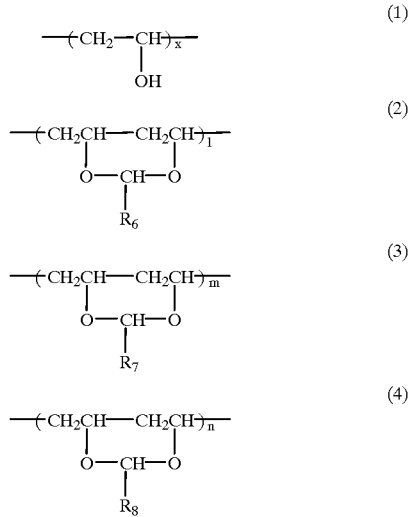

(wherein $R_6$ represents alkyl group, $R_7$ represents carboxylic group or alkyl group having an amino group, $R_8$ represents an aromatic group, l, m, n 0, l+m+n>0, x>0)

(b) epoxy resin including in the skeleton naphthalene ring, and (p (c) compound capable of generating an acid or alkali by exposure.

The light-sensitive composition (A) include acetal resin. The above-mentioned acetal resin in the light-sensitive composition (A) can be obtained by the acid catalyzed reaction of polyvinylalcohol with aldehyde containing $R_6$–$R_8$ substituent.

In the above-mentioned method a unit represented by following formula (5) remained as small amounts of unreactant units of polymer precursor of polyvinyl acetate, which is a starting material of polyvinylalcohol.

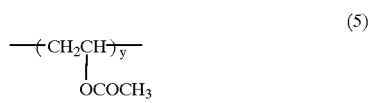

(wherein y>0)

The molecular weight of the above mentioned acetal resin is preferably in a range of 1,000 to 300,000. If the molecular weight of the above-mentioned acetal resin is out of the above-mentioned range, a solubility of the acetal resin to the solvent is decreased.

A content of unit represented by formula (1) in the acetal resin is preferably arbitrarily selected in accordance with a solvent in which the the acetal resin is dissolved. If the acetal resin is dissolved in the water or alcohol-series solvent, a content of unit represented by formula (1) is preferably 50 mol % or less. If the acetal resin is dissolved in an organic solvent except alcohol, content of the units represented by formula (2) is preferably 50 mol % or more. If the content of unit represented by formula (1) is out of these ranges, a solubility of the acetal resin to the corresponding solvent is decreased.

A content of unit represented by formula (3), or (4) is preferably 50 mol % or less for synthesys reason. If the content of unit represented by formula (3) or (4) is out of these range, the starting resin is cross-linked in a synthesis process. Therefore, corresponding the acetal resin can not be obtained.

The unit represented by formula (3) gives effects of increasing solubility of the resin to acid, and the unit represented by formula (4) has effects of increasing a solubility to alkali, each of them are preferably introduced at least 1 mol %, more preferably, 5 mol %–30 mol %.

The light-sensitive composition (A) include an epoxy resin containing naphthalene ring in the skeleton. By including the epoxy compound containing naphthalene ring in the skeleton, a photosensitivity of the light-sensitive composition (A) is improved.

All of the naphthalene compounds having at least one, and preferably 2 or more epoxy groups in a molecule can be employed, preferably epoxy resin or epoxy compound which are synthesized by the reaction of polyhydroxynaphthalene with epichlohydrine in the presence of basic catalyst.

Example of the polyhydroxynaphthalene compound are preferably naphthol-series compound such asdihydroxidenaphthalene, naphthol-novolak compound which is obtained by condensing naphthol-series compound by formaldehyde.

The content of the epoxy compound containing naphthalene ring, is preferably arbitrarily selected in accordance with a molecular weight of the epoxy compound containing naphthalene ring, 1–70 parts by weight, preferably 5–50 parts by weight. If the content of the epoxy compound is less than one part by weight, the composition does not have sufficient photo sensitivity. On the other hand, if the content of the epoxy compound is more than 70 parts by weight, the composition does not have sufficient heat resistance and transparency, and uniform coatings can not be obtained with conventional spin-coating method, which is usually employed in the resist process on semiconductor substrates.

Example of the compound capable of generating an acid by exposure (i.e. optical acid generating agent) in the light sensitive composition (A), aronium salts, derivatives of o-quinone diazide sulfonate, sulfonyl compounds, sulfonic acid esters, organic halogen compounds, and the like.

Example of the onium salt are: diazonium salts, phosphonium salts, sulfonium salts, iodonium salts, each having $PF_6^-$, $SbF_6^-$, $AsbF_g^{-1}$, $CF_3SO_3^-$ (trifluoromethanesulfonic anion), $CH_3C_6H_4SO_3^-$ (p-toluene sulfonate anion), or like which functions as a counter anion. Onium salt of Trifluoromethanesulfonic acid and triarylsulfide are more suitable for use in the invention. These onium salts are known as optical acid generating agent which are very sensitive to a chemical radiation. Example of the sulfonyl compounds are: discribed in Japanese patent application No. H4-53729. Example of sulfonyl compounds are derivatives of arylmethyl sulfone, derivatives of bis(arylsulfonyl)methane, derivatives of diaryl methylsulfonylmethane, derivatives of dimethylsulfonylmethane and, derivatives of α, α-bis(arylsulfinyl)diazomethanes, and the like, for example, bis(phenylsulfonyl)methane, (phenylsulfonyl)acetonitrile, 1-methyl-2-((phenylsulfonyl)methyl)benzene and the like have so high photo-sensitively that they are especially suitable for use.

The organic halogen compounds, described above, are compounds which firm hydrohalogenic acid. Examples of these compounds are those disclosed in U.S Pat. No. 3,515, 552, U.S. Pat. No. 3,779,778, and German offenlegungsschrift 22 43 621.

Example of other compounds which generate acids when exposed to chemical radiations are those disclosed in Published Unexamined Japanese Patent Applications 54-74728, 55-24113, 55-77742, 60-3626, 60-138539, 56-17345, and 50-36209.

More specifically, examples of the compounds which generate acids when exposed to chemical radiations are:

di(p-tert-butylbenzene) diphenyliodoniumu trifluoro-methanesulfonate, benzoine tosylate, o-nityobenzyl p-toluenesulfonate, triphenylsulfonium trifluoromethane-sulfonate, tri(tert-butylphenyl)sulfonium trifluoromethanesulfonate, benzenediazoniumu p-toluenesulfonate, 4-(di n-propylamino)-benzoniumtetrafluoroborate, 4-p-tolyl-mercapto-2,5-diethoxy-benzeneduazonium hexafluorophosphate, tetrafluoro borate, diphenylamine-4-diazobium sulfate, 1,8-naphthalimidyl triflate, nafthalene containing onium salts (NAT-103, NAT-105, NDS-103, NDS-105 acid generator (Midori-Co., CAS[131582-00-8], [137867-61-9] and [110098-97-0])), 4-methyl-6-trichloromethyl-2-pyrrone, 4-(3,4,5-trimethoxy-styryl)-6-trichloromethyl-2-pyrone, 4-(4-methoxy-styryl)-6-(3,3,3-trychloro-propenyl)-2-pyrone, 2-trichloromethylbenzimidazole, 2-tribromomethyl-quinolone, 2,4-dimethyl-1-tribromoacetyl-quinolone, 2,4-dimethyl-1-trybromoacetyl-benzene, 4-dibromoacetyl-benzoic acid, 1,4-bis-dibromomethylbenzene, tris-dibromomethyl-S-triazine, 2-(6-methoxy-naphthyl-2-yl)-4,6-bis-trichloromethyl-S-triazine, 2-(naphthyl-1-yl)-4,6-bis-trichloromethyl-S-triazine, 2-(naphthyl-2-yl)-4,6-bis-trichloromethyl-S-triazine, 2-(4-ethoxyethyl-naphthyl-1-yl)-4,6-bis-trichloromethyl-S -triazine, 2-(benzopyranyl-3-yl)-4,6-bis-trichloromethyl-S-triazine, 2-(4-methoxy-anthoracyl-1-yl)-4,6-bis-trichloromethyl-S -triazine, 2-(phenantyl-9-yl)-4,6-bis-trichloromethyl-S-triazine, o-naphthoquinonediazide-4-sulfonic chloride, and the like.

In the case of the light-sensitive composition (A), the content of the acid generating agent when exposed to a chemical radiation (i.e., the acid generating agent) is 0.01% to 20% by weight, preferably 0.2% to 10% by weight based on the weight of the solid components of the composition.

If the content of the acid-generating agent is less than 0.01% by weight, it does not efficiently work as a catalyst in the decomposition reaction or the cross-linking reaction. If the content of the acid-generating agent is more than 20% by weight, it may result the ununiform resist film.

Example of the compound capable of generating an alkali by exposure i.e. alkali generating agent in the light-sensitive composition(A), are carbamate compound, sulfonamide compound, especially nitrobenzil cyclohexylcarbamate, dimethoxybenzylcyclohexylcarbamate, N-Cyclohexylmethylphenylsulfonamide, N-cycrohexyl-naphthylsulfonamide are more suitable for use in the invention. In the case of the light-sensitive composition (A), the content of the optical alkali generating agent is 0.01% to 20% by weight, preferably 0.2% to 10% by weight based on the weight of the solid components of the composition.

If the content of the optical alkali-generating compound is less than 0.01% by weight, it does not efficiently work as catalyst in the decomposition reaction or crosslinking compound. If the content of the optical alkali generating agent is more than 20% by weight, it may make also result the ununiform resist coating.

The light-sensitive composition (A) is one of the most preferable composition. This is because of a high efficiently of the cross-linking reaction by the photo-irradiation, and the enough transparency during the exposure. In the acetal resin, photo-acid or photo-alkali catalyzed reactions make the layer (film) insoluble of the intermolecular cross-linking and the simultaneous elimination of hydroxyl group. These mechanism are effectively applied to the negative resist.

And by adding a epoxy compound to above-mentioned light-sensitive composition including the acetal resin, a cross-linking efficiency and photosensitivity are increased. The introduction of the naphthalene ring into the skeleton of the epoxy compound is also preferable, since it raises the total content of carbon in the composition, therefore it also raises the dry etching resistance of the resist layer.

Another preferable example of the light-sensitive composition containing at least one aromatic compound having an aromatic ring with from 4 to 12 conjugated double bonds in the structure is a light-sensitive composition (B) shown below.

The light-sensitive composition (B) comprises:

a copolymer of vinyl compounds having an epoxy group in the side chain;

a polyhydroxide compound having naphthalene ring in the skeleton; and a compound capable of generating an acid or alkali by exposure.

Example of the copolymer of vinyl compound having an epoxy group in the side chain is a copolymer of glycidyl methacrylate, a copolymer of alyciclyl ether, a copolymer of 1,2-epoxy-5,9-cyclododecadiene, a copolymer of 1,2-epoxy-5-hexane, or a copolymer of methylvinyloxirane.

Preferably, the copolymer of vinyl compound having epoxy group in the side chain, is the 3 components copolymer of vinyl compound having epoxy group in the side chain, vinyl compound having aromatic ring in the side chain and vinyl compound having carboxyl group in the side chain. The light sensitive compound(B) containing the copolymer described above has sufficient photosensitivity and sufficient alkali solubility and high dry etching resistance.

Examples of above mentioned vinyl compound having an aromatic ring in the side chain are styrene, vinylnapthalene, vinyl anthracene, vinyl carbazol, vinyl phenol, vinyl naphthol and chloro methyl styrene.

Example of above mentioned vinyl compound having carboxylic acid in the side chain are acrylic acid, methacrylic acid and maleic anhydride.

The copolymers with these acidic groups may also be formed with the de-protection reaction of the corresponding copolymers of trimetylsiril ester or tert-butyl ester of acid substituted vinyl compounds.

The said 3 compounds copolymer preferably including 5–40 mol % of vinyl unit having epoxy group in the side chain, 10–50 mol % of vinyl unit having carboxylic group in the side chain. If the content of each vinyl units having epoxy group fall in said range, one of photosensitivity and sufficient alkali solubility and dry etching resistance of light sensitive composition are decreased.

The light-sensitive composition(B) includes the polyhydroxide compound as a cross-linking agent. Examples of polyhydroxide compound can be preferably naphthol-series compounds such as dihydroxynaphthalene, and naphthol novolak compound which is obtained by condensing naphthol-series compound by aldehydes.

The content of the polyhydroxynaphtalene compound is preferably arbitrarily selected in accordance with a content of epoxy group being contained in other solid components of the composition. The preferable content of polyhydroxide compounds is 1–50 parts by mole fractions of epoxy group in the solid components of the composition, more preferably 5–50 parts by mole fractions of epoxy group in the solid components of composition. If the content of the polyhydroxidenaphthalene compound is less than 1 part by mole fraction of epoxy group in the solid components of composition, dry etching resistance of the light sensitive composition will be decreased. If the content of the polyhydroxidenaphthalene compound is more than 50 parts by mole fraction of epoxy group in the solid components of composition, the coating characteristics and/or solubility to the resist solvent are getting worse.

Example of the optical acid generating agent by exposure in the light-sensitive compound (B), and the optical alkali generating agent are exemplified for above-mentioned for light sensitive composition (A). In the case of the light-sensitive composition (B), the content of the optical acid or alkali generating agent may be 0.01 to 20% by weight, preferably 0.2 to 10% by weight based on the weight of the solid components of the composition.

If the content of the acid or optical alkali-generating agent is less than 0.01% by weight, the sensitivity of the light sensitive composition will decreased. If the content of the optical acid or alkali generating compound is more than 20% by weight, the coating characteristics will be worse.

In the case of the light sensitive composition (B), the copolymer of vinyl compound having epoxy group effectively cross-links by an catalysis of the optical acid or alkali generating agent.

The above-mentioned light sensitive composition (A) and (B) may optionally include a surfactant as a film improving agent or dye as a reflection inhibitor.

The light sensitive-composition (A) and (B) may be prepared by dissolving the above-mentioned components and other additives in a suitable solvent followed by filtering the resulting solution. Examples of solvents usable for the dissolution include, for example water, ketone solvents such as cyclohexanone, acetone, methyl ethyl keton, methyl isobutyl ketone and the like; cellosolve solvents such as methyl cellosolve, methyl cellosolve acetate, ethyl cellosolve, ethyl cellosolve acetate, butyl cellosolve, butyl cellosolve acetate, and the like; ester solvents such as ethyl acetate, butyl acetate, isoamyl acetate, ethyl lacetate, methyl lactate and the like; alcohol solvents such as 2-butanol, isoamyl alcohol, diethylene glycol and the like; polyalcohol derivative solvents such as ethylene glycol diethy ether, diethylene glycol monoethyl ether, ethyl carbitol and the like; and monopholine, N-methyl-2-pyrrolidone. These solvents may be used either singly or as a mixture of them.

Next, in the second step to follow the above-mentioned first step, the light-sensitive layer is patternwise-exposed with a electromagnetic radiation light having a wavelength range from 180 to 220 nm to cause a photochemical reaction in the light-sensitive layer. As a light source, for example an ArF excimer layer (193 nm) or fifth harmonics of YAG laser (213 nm) is employed. As a concrete operation for the exposure, the light-sensitive layer is patternwise-exposed to the light via a mask having a desired pattern.

In this step, the light-sensitive layer contains as an essential component, an aromatic compound having an aromatic ring with from 4 to 12 conjugated double bonds in the structure, so that the light absorption in the exposed area of the light-sensitive layer is reduced and the light transmittance through the area is extremely elevated, whereby the intended photochemical reaction may be promoted sufficiently throughout the whole thickness of the layer.

The photochemical reaction in the exposed area of the light-sensitive layer advances by a different mechanism, depending upon the kind of the light-sensitive composition of the layer. For instance, in the exposed area of the light-sensitive layer comprising the above-mentioned positive resist, the high polymer chains in the resin component are cut to give low molecular substances or the insoluble compound is changed to a soluble substance by the photochemical reaction. In the exposed area of the light-sensitive layer comprising the above-mentioned negative resist, the high polymer chains in the resin component are crosslinked to form a two-dimensional or three-dimensional molecular structure.

In the exposed area of the light-sensitive layer of the above-mentioned chemically amplified resist, for example the optical acid or alkali-generating agent generates acid or alkali, and the acid or alkali decomposes the side chains of the resin component (in the case of a positive resist), or the resin component is crosslinked by acid or alkali catalyzed of crosslinker (in the case of a negative resist).

Especially in the case, the patternwise exposed light-sensitive layer is optionally heat-treated at a temperature falling within the range of approximately from 70° C. to 160° C., preferably from 80° C. to 150° C. (post exposure bake, PEB), if desired, so as to promote the amplifying reaction, i.e., to diffuse the acid as generated in the exposed area of the light-sensitive layer as mentioned above so that the reaction between the acid or alkali and other components is promoted. The reason of the definition of the temperature range in the heat treatment step is because if the temperature is lower than 70° C., the above-mentioned reaction could not be effected sufficiently, but if it is higher than 160° C. the exposed area and the non-exposed area in the radiation-sensitive layer would be decomposed or hardened.

Next in the third step to follow the above-mentioned second step, the above-mentioned exposed or heat-treated light-sensitive layer is developed with a determined developer. Further, it is rinsed with a pure water to remove the developer and then the substrate is dried.

In the third step (for development), in general, either one of the exposed area and the non-exposed area of the light-sensitive layer is selectively dissolved with the developer and removed to give a determined pattern. Especially in the present invention, since the photochemical reaction in the exposed area advances sufficiently, the selectivity between the exposed area and the non-exposed area is high to give a pattern with a high resolving power.

As the developer for the development, usable is an aqueous solution or an aqueous of an organic alkali substance such as tetramethylammonium hydroxide or of an ordinary inorganic alkali substance, an alcohol solution or the like. For a resist, the molecular weight of which varies by the photochemical reaction used, and an organic solvent, for example, ketone such as methyl ethyl ketone or methyl isobutyl ketone or cycrohexanone or esters such as butyl acetate or the like may be used as the developer.

The method of forming a pattern according to an embodiment of the present invention is characterized in that a light-sensitive layer containing an aromatic compound is exposed with light having a wavelength range shorter than the maximum wavelength at which maximum absorption occurs in the third absorption band and longer than a wavelength at which maximum absorption occurs in forth absorption band, thereby to cause a photochemical reaction in the light-sensitive layer.

By employing the exposure mode of this kind, the light absorption in the light-sensitive layer is reduced while the light transmittance through the layer is elevated so that the photochemical reaction sufficiently advances throughout the whole layer in the direction of the film thickness. As a result, a pattern having a high resolving power and additionally having a sufficient dry-etching resistance due to the characteristic of the aromatic ring of the above-mentioned aromatic compound can be obtained.

In the case that a light-sensitive layer containing aromatic compound including an aromatic ring with 3 or less conjugated double bonds, such as benzene derivatives are used, the exposure with a light having a wavelength range shorter than the maximum wavelength at which maximum absorption occurs in the third absorption band and longer than a wavelength at which maximum absorption occurs in forth absorption band, to cause an effective photochemical reaction in the light sensitive layer.

In the patternwise-exposed step, the light sensitive layer is selectively exposed with a light having a specific wavelength range in accordance with the composition of the layer to cause a photochemical reaction in the layer.

In this step, the wavelength range of the exposure light layer is suitably selected in accordance with the above-mentioned definition of wavelength range depending upon the structure of the aromatic compound contained in the layer or upon the structure of the aromatic ring(s) in the compound. For instance, where the aromatic ring is a benzene ring, the wavelength range of the light for exposure is approximately from 170 to 150 nm, where the ring is a naphthalene ring, it is approximately from 210 to 170 nm, and where the ring is an anthracene ring, it is approximately 230 to 190 nm. The wavelength range of the light varies, depending upon the substituent(s) to be introduced into the aromatic ring. For instance, if a substituent such as a halogen atom or a nitro group is introduced into the ring, the wavelength range of the light to be used for exposure is shifted to the long-wavelength side by about 10 nm or so.

Where the substituent has a double bond capable of being conjugated with the double bond of the aromatic ring, it is noticeably shifted to the long-wavelength side.

The "maximum wavelength in an absorption band" as referred to herein means the peak wavelength in the absorption band (i.e., the wavelength with an absorption peak therein). As mentioned above, the absorption band of an aromatic compound is caused by a light absorption to follow the excitation of the electrons in the aromatic ring of the compound, but it does not contain extremely weak triplet electron transition. Strictly, it is considered that the above-mentioned third absorption band from the long-wave side is an overlap of two adjacent absorptions and that it is one in a symmetric molecule.

On the other hands, the compounds including a aromatic range with from 4 to 12 conjugated double bonds in the structure, which are used in the method of this invention, may generate an relatively strong fluorescent light by exposure. By using such compounds which generate a fluorescent light by exposure, as a light-sensitive layer to form patterns, the light sensitive layer is exposed by both their radiated light and the internal fluorescent light generated by irradiation. In particular, since the fluorescent light is generated in the inside of the light-sensitive layer and it has a longer wavelength range than the irradiated light such as short-wavelength ultraviolet rays or the like, it has excellent light transmittance and/or reactivity in the inside of the layer. Therefore, even though the light transmittance of the irradiated light is reduced due to the aromatic rings contained in the layer, the photochemical reaction may sufficiently advance due to the action of the fluorescent light with the result that a pattern having a high resolving power and an excellent dry-etching resistance can finally be obtained by the method.

Example of the compound of generating fluorescent light by exposure is a aromatic compound having a structure being destroyed molecular symmetry. In particular, the compounds containing aromatic ring(s) with from 4 to 12 conjugated double bonds in the structure, which are used in the second method, may generate an strong fluorescent light by exposure. The compound of generating a fluorescent light and the aromatic compound contained in the light-sensitive layer may be the same one. In addition, other various fluorescent dyes may also be used as a compound of generating a fluorescent light by exposure. Various fluorescent dyes may be added to the above-mentioned aromatic compound so as to elevate their effect of generating a fluorescent light. Examples of usable fluorescent dyes include acridine orange, aminoacridine, quinacrine, anilinonaphthalenes-sulfonic acid derivatives, anthroyloxystearic acid, auramine-O, chlorotetracycline, cyanine dyes such as merocyanine and 1,1'-dihexyl-2,2'-oxacarbocyanine, dancyl chloride derivatives such as dansyl sulfoamide, dansyl choline, dansyl galactoside, dansyl tolidine and dansyl chloride, diphenylhexatriene, oesine, $\epsilon$-adnosine, ethidium bromide, fluroesceine, formycine, 4-benzoylamido-4'-aminostilbene-2,2'-sulfonic acid, $\beta$-naphthy 1-triphosphoric acid , oxonole dyes, parinaric acid derivatives, perylene, N-phenylnaphthylamine, pyrene, safranine-O, fluorescamine, fluoresceine isocyanate, 7-chloro-4-nitrobenz-2-oxa-1,3-diazole, dancyl aziridine, 5-(iodoacetamido-ethyl)aminonaphthalene-1-sulfonic acid, 5-iodoacetamidofluoresceine, N-(1-anilinonaphthyl)-4-maleimide, N-(7-diemthyl-4-methylcoumanyl) maleimide, N-(3-pyrene)meleimide, eosine 5-iodoacetamide, fluoresceine mercury acete, amino naphthalane compounds such as 2-[4'-(2''-iodoacetylamido)amino-anphthalene-6-sulfonic]

acid, eosine, and rhodamine derivatives. The amount of the fluorescent dye contained in the light-sensitive composition (resist) is preferably from 1% by weight to 50% by weight of the solid content of the composition. If the amount of the fluorescent dye is less than a 1% by weight, the effect of elevating the sensitivity of the composition is poor, but if it is more than 50% by weight, the resolving power and the sensitivity of the composition are rather lowered.

In the above-mentioned method, since the light-sensitive layer contains a compound for generating a fluorescent light by which the photochemical reaction in the layer is promoted, other rays of various wavelength ranges may be used for exposure of the layer. Specific examples of usable rays include ultraviolet rays, far-ultraviolet rays, vacuum-ultraviolet rays, synchrotorn orbital radiation rays, electron rays, X-rays, gamma rays, ion beams, etc.

Next, another method of forming a pattern according to the present invention will be explained.

A method practiced according to the present invention comprises:

a step of forming on a substrate a light sensitive layer comprising laminated structure including a first layer including an aromatic compound and a second layer including a fluorescent light generating compound;

a step of patternwise-exposing the light-sensitive layer at least an electromagnetic radiation to generate a fluorescent light causing photo chemical reaction in the first layer at least due to the action of the fluorescent light; and a step of developing the exposed light-sensitive layer and fluorescent light-generating layer so as so selectively remove the exposed area of the light-sensitive layer.

The compound for generating a fluorescent light by exposure, can be mixed with a suitable resin composition and coated on the substrate as a separate layer (i.e., as a fluorescent light-generating layer).

In accordance with the method the photochemical reaction is sufficiently promoted in the light-sensitive layer by the action of the fluorescent light to be generated in the fluorescent light-generating layer by exposure and also by the action of the irradiated light to result that a pattern having a high resolving power and having an excellent dry-etching resistance can finally be obtained.

In the above-mentioned method, for example, inorganic fluorescent agents may be used as the compound of including in the fluorescent light-generating layer. Examples of such fluorescent agents include salts which are generally used in fluorescent paints, fluorescent lamps, fluorescent bodies for CRT, pigments and others. Specific examples of them include $MgWO_4$, $CaWO_4$, $(Ca,Zn)(PO_4)_2:Ti^+$, $Ba_2P_2O_7:Ti$, $BaSi_2O_5:Pb_2^+$, $Sr_2P_2O_7:Sn_2^+$, $SrFB_2O_{3.5}:Eu_2^+$, $MgAl_{16}O_{27}:Eu_2^+$, tungstates and the like salts of inorganic acids.

Since the inorganic fluorescent agents generally have poor solubility, they are dispersed in a suitable solvent as a fine powder along with a high polymer binder, and the mixing system is coated on a substrate to form a layer. As the binder, any high polymer material in which the above-mentioned fluorescent agent may be dispersed may be employed. In consideration of lamination of the layer along with a light-sensitive layer on a substrate, the binder is preferably a water-soluble high polymer. Examples of such high polymer materials include polyvinyl alcohol and copolymers of maleic acid, acrylic acid and a vinyl or acrylic compound. The fluorescent agent and the high polymer binder may be dispersed or dissolved in a solvent, whereupon a surfactant and/or dispersing agent may be added thereto, if desired.

the thickness of the above-mentioned fluorescent light-generating layer is preferably within the range of approximately from 0.05 to ).05 μm. If the defined range is exceeded, the sensitivity and the resolving power of the light-sensitive layer is noticeably lowered.

The above-mentioned fluorescent light-generating layer may be formed either above or below the light-sensitive layer.

Where the layer is formed as an upper layer above the light-sensitive layer, a mixed system containing the above-mentioned fluorescent light-generating compound is coated over the light-sensitive layer as formed in the same manner as in the above-mentioned methods, in the thickness as mentioned above. Subsequently, the coated layer is baked at a temperature of approximately from 70 to 120° C. to disperse the solvent in the mixed system to form the intended fluorescent light-generating layer. Next, in the same manner as in the above-mentioned method, the coated base is exposed and then optionally heat-treated, then the fluorescent light-generating layer is removed with a suitable solvent or developer, and the exposed light-sensitive layer is developed to form a pattern.

On the other hand, where the above-mentioned fluorescent light-generating layer is formed as a lower layer below the light-sensitive layer, a fluorescent light-generating layer is first formed on a substrate in the same manner as above. Subsequently, a light-sensitive layer is formed over the layer, and the coated substrate is exposed and then optionally heat-treated and thereafter developed to form a pattern, in the same manner as in the above-mentioned third method. In this case, the fluorescent light-generating layer formed may be washed off along with the binder polymer by a spraying method or may be removed by a dry-etching method. The latter method is especially preferred, in which $CF_4$ or HBr may be used as an etching gas.

By forming the fluorescent light-generating layer as a lower layer below the light-sensitive layer in the manner as mentioned above, the photochemical reaction in the deep range of the light-sensitive layer to which the irradiating light hardly reaches may well be promoted.

The present invention will be explained in more detail by way of the following examples, which, however, are not intended to restrict the scope of the present invention.

EXAMPLE 1

In the following synthetic Examples 1 and 2, resin compositions to be incorporated into a light-sensitive composition were produced.

SYNTHETIC EXAMPLE 1

0.3 mol of 2-naphthyl methacrylate and 0.7 mol of tert-butyl methacrylate were mixed with 200 g of toluene, and 2 g of azoisobutylonitrile (AIBN) was added thereto. The mixed system was heated at a temperature of 70° C. for 8 hours and then purified by dropping it into acetone-methanol solvent, to obtain a copolymer of naphthyl methacrylate and tert-butyl methacrylate (Resin A).

The same process as described above was repeated, except that the naphthyl methacrylate was replaced by vinyl-naphthalene, vinyl-anthracene or vinyl-carbazole, to obtain 3/7 copolymers with tert-butyl methacrylate (Resins D to F).

In addition, a commercial product of naphthol novolak (Resin C) was prepared. The individual resin compositions are mentioned below.

SYNTHETIC EXAMPLE 2

1-Hydrox-2-naphthylaldehyde was mixed with sodium ethoxide, and ethanol was removed to obtain sodium salt of 1-hydroxy-2-naphthylaldehyde. Subsequently, benzoyl chloride was dropped to the salt to obtain 1-benzoyloxy-2-naphthol-aldehyde. 0.9 mol of malonic acid was added to 0.25 mol of 1-benzoyloxy-2-naphthol-aldehyde, and 10 ml of pyridine was added thereto and reacted at a temperature of 110° C. for 2 hours to obtain 1-benzoyloxy-2-β-carboxyl) vinylnaphthalene. 0.14 mol of the 1-benzoyloxy-2-β-carboxyl)vinylnaphthalene 0.14 mol. of the 1-benzoyloxy2βcarboxyl)vinylnaphthalene) was dissolved in 100 ml of quinoline, and 5 g of copper powder was added thereto and reacted for further one hour at a temperature of 220° C. to obtain a 1-benzoyloxy-2-vinylnaphthalene. Next, 0.1 mol of 1-benzoyloxy-2-vinylnaphthalene was polymerized in benzene in the presence of AIBN in the same manner as in Synthetic Example 1 to obtain poly(1-benzoyloxynaphthalene). The poly(1-benzoyloxynaphthalene) of an amount corresponding to 0.5 mol of the monomer was dissolved in acetone, and 1 g of aqueous 1 N sodium hydroxide solution was added thereto and heated to obtain poly(vinylnaphthol) (Resin B). The obtained polymer was purified by reprecipitating it in an acetone-water-oxalic acid solution.

The compositions of the resins are as follows:

Resin A: 3/7 Copolymer of naphthyl methacrylate and tert-butyl methacrylate (molecular weight: 20,000)

Resin B: poly(vinylnaphthol) (molecular weight: 7,000)

Resin C: β-Naphthol novolak (commercial product, molecular weight: 4,500)

Resin D: 3/7 Copolymer of vinylnaphthalene and tert-butyl acrylate (molecular weight: 6,000)

Resin E: 3/7 Copolymer of vinylanthracene and tert-butyl acrylate (molecular weight: 5,500)

Resin F: 3/7 Copolymer of vinylcarbazole and tert-butyl crylate (molecular weight: 7,000)

In addition, the following Resins G to I were prepared. These resins have no aromatic ring in their structure.

Resin G: poly-tert-butyl acrylate (molecular weight: 12,500)

Resin H: polyallyl methacrylate (molecular weight: 24,000)

Resin I: polyglycidyl methacrylate (molecular weight: 20,000)

In the following synthetic Examples 3 and 4, compounds (dissolution inhibitors) having bonds capable of being decomposed of an acid, which are to be incorporated into a light-sensitive composition, were produced.

SYNTHETIC EXAMPLE 3

Polyvinyl naphthol B was reacted with sodium hydride, whereby a part of the hydroxyl groups in the polyvinyl naphthol were substituted by sodium salts. Subsequently, it was reacted with di-tert-butyl dicarbonate, so that tert-butoxycarbonyl group was introduced thereinto. Thus, Compound (a) having bonds capable of being decomposed by an acid was obtained. The proportion of the tert-butoxycarbonyl group introduced into the compound was 20 mol % of all the hydroxyl groups in the polyvinylnaphthol.

SYNTHETIC EXAMPLE 4

Polyvinylnaphthol was reacted with tert-butyl bromoacetate, using potassium carbonate and potassium iodide as catalysts, so that tert-butyl acetate was introduced into the polymer. Thus, Compound (d) having bonds capable of being decomposed by an acid was obtained. The proportion of the tert-butyl acetate as introduced into Compound (b) was 19 mol % of all the hydroxyl groups in the polyvinylnaphthol.

In addition, the following compounds having a bond capable of being decomposed by an acid were prepared.

Compound (c): Tert-butoxycarbonylnaphthol

Compound (d): Naphthol tert-butyl acetate

Compound (e): Tri-(tert-butoxycarbonyl)anthrarobin

Compound (f): Tert-butoxycarbonyloxyphenanthrene

In the following Synthetic Example 5, an optical acid-generating agent to be incorporated into a light-sensitive composition was produced.

SYNTHETIC EXAMPLE 5

0.2 mol of anthrarobin was dissolved in tetrahydrofuran, three-molar time of methanesulfonyl chloride was added thereto, and 0.6 mol of triethylamine was gradually dropped thereinto. Subsequently, triethylamine and tetrahydrofuran were removed from the reaction system, and the product was recrystallized to obtain anthrarobin tri (methanesulfonata) (Compound g).

In addition, the following optical acid generating agents (Compounds h to k) were prepared.

Compound (h): Naphtholnaphthoguinonediazide 4-sulfonate

Compound (i): Triphenylsulfonium trifluorate

Compound (j): Methylsulfonylacetonitrile

Compound (k): Melamine resin (Saimel 325)

Preparation of Light-sensitive Compositions (Resists):

The above-mentioned compounds (components) were combined in accordance with the formulations as indicated in Table 1 below to prepare light-sensitive compositions 1 to 17. Precisely, ethyl cellosolve acetate was added to the components of the indicated formulation in an amount of three times by weight of the solid contents of the formulation and then stirred for 6 hours at room temperature, and the resulting mixture was filtered through a Teflon filter having a pore diameter of 0.2 μm to prepare a varnish of a light-sensitive composition.

TABLE 1

Formulation of Light-Sensitive Composition (Resist)

| Composition No. | Resin Component (Wt. %) | Compound Having Bond Decomposable With Acid (Wt. %) | Optical Acid Generating Agent (Wt. %) |
|---|---|---|---|
| 1 | A(97) | — | i(3) |
| 2 | A(95) | — | j(5) |
| 3 | B(67), G(30) | — | i(3) |
| 4 | G(50) | a(45) | g(5) |
| 5 | G(50) | b(45) | h(5) |
| 6 | C(47), G(50) | — | i(3) |
| 7 | D(97) | — | i(3) |
| 8 | E(97) | — | i(3) |
| 9 | F(97) | — | i(3) |
| 10 | G(70) | c(25) | g(5) |
| 11 | G(70) | d(30) | i(3) |
| 12 | G(65) | e(30) | g(5) |
| 13 | G(65) | f(30) | g(5) |
| 14 | B(80) | — | i(3), k(17) |
| 15 | H(47), B(50) | — | i(3) |
| 16 | I(47), B(50) | — | i(3) |
| 17 | B(70), G(20) | — | h(10) |

Using the above-mentioned light-sensitive compositions, patterns were formed.

Each varnish of the light-sensitive compositions Nos. 1 to 17 as shown in Table 1 above was coated on a 5-inch silicon wafer by spin-coating and then pre-baked on a hot plate of 110° C. for 5 minutes to form a light-sensitive layer (resist film) having a thickness of 0.9 μm.

Next, the light-sensitive layer was patternwise-exposed to an ArF excimer laser ray (having a wavelength of 193 nm) by contact-exposure and then baked on a hot plate of 110° C. for 2 minutes. Subsequently, the wafer was dipped in the developer shown in Table 2 below for 60 to 200 seconds to develop the light-sensitive layer. Further, the thus-developed wafer was washed with water and dried to form a pattern composed of determined lines and spaces.

The thus-formed patterns were observed with scanning electromicroscope (hereinafter referred to as SEM) to evaluate the resolution of them. With respect to the patterns thus-formed, the data of the sensitivity and the resolution (width of lines of pattern) of the light-sensitive layer (formed of the light-sensitive composition) are shown in Table 2 below.

TABLE 2

Formation of Patterns (Example 1)

| Composition No. | Sensitivity (mJ/cm$^2$) | Resolution (μm) | Developer |
|---|---|---|---|
| 1 | 120 | 0.4 (positive) | 2.38% TMAH |
| 2 | 200 | 0.4 (positive) | 2.38% TMAH |
| 3 | 95 | 0.4 (positive) | 2.38% TMAH |
| 4 | 115 | 0.4 (positive) | 2.38% TMAH |
| 5 | 140 | 0.4 (positive) | 2.38% TMAH |
| 6 | 240 | 0.4 (positive) | 2.38% TMAH |
| 7 | 180 | 0.4 (positive) | 2.38% TMAH |
| 8 | 210 | 0.4 (positive) | 2.38% TMAH |
| 9 | 220 | 0.5 (positive) | 2.38% TMAH |
| 10 | 120 | 0.4 (positive) | 2.38% TMAH |
| 11 | 140 | 0.4 (positive) | 2.38% TMAH |
| 12 | 160 | 0.5 (positive) | 2.38% TMAH |
| 13 | 160 | 0.5 (positive) | 2.38% TMAH |
| 14 | 75 | 0.5 (negative) | 2.38% TMAH |
| 15 | 80 | 0.5 (negative) | Ethanol 2.38% TMAH |
| 16 | 90 | 0.5 (negative) | Ethanol 2.38% TMAH |
| 17 | 150 | 0.5 (positive) | 2.38% TMAH |

Condition: Contact-exposure with ArF excimer laser ray post-exposure baking at 110° C. for 2 minutes
Thickness of light-sensitive layer: 0.9 μm
Developer: TMAH (2.38% water solution of tetramethylammonium hydroxide)

EXAMPLE 2

The polymer components, which were incorporated into the light sensitive compositions, were synthesized with following method.

A commercial product of acetal resin (Esreck BLS manufactured by SEKISUI CHEMICAL Co., Ltd) (resin J) was prepared.

In the following synthetic Examples 6 and 7, acetal resins with functional groups were synthesized by using following method.

SYNTHETIC EXAMPLE 6

2 g of polyvinyl alcohol (molecular weight: 22500), 3 ml of glyoxylic acid, and 4.5 ml of concentrated $H_2SO_4$ were dissolved in 30 ml of water. The solution was heated at 60° C. for 48 hours, then it was neutralized to obtained glyoxylic acid substituted acetal polymer of polyvinyl alcohol (resin K). 20 mol % of acetal substituted —OH in PVP. The obtained polymer and reprecipitated by using water-methanol solution.

SYNTHETIC EXAMPLE 7

Amono-acetal substituted polymer of polyvinyl alcohole (resin L) was obtained by a method described in a references (Colloid Polym Sci. 252.294(1974)). 5 mol % of amino acetal substituted —OH.

Using the methods in the following synthetic Examples 8 and 9, epoxy resin compositions for incorporation into a light-sensitive composition were prepared.

SYNTHETIC EXAMPLE 8

0.05 mol of 1,5-naphthalenediol was mixed with 0.1 mol of epichlorohydrine, then gradually added 0.25 g of water, and 4.0 g of NaOH. The mixture system was heated at 70° C. for 2 hours and then unreactant epichlorohydrine, was removed under the reduced pressure at 30 mm Hg, then epoxy resin was extracted with toluene.

After removing toluene under the reduced pressure, epoxy resin of 1,5-naphthalenediol (resin M) was obtained.

SYNTHETIC EXAMPLE 9

0.05 mol of 4,4"-methlenebis(dihydroxy naphthalene) was mixed with 0.1 mol of epichlorohydrine, then added 0.25 g of water, and 0.8 g of NaOH. The mixture was heated at 70° C. for 2 hours then, unreactant epichlorohydrine was removed under reduced pressure at 30 mmHg then, epoxy resin was extracted with toluene.

After removing the toluene under reduced pressure, partially epoxy group introduced 4,4"-methlenebis(dihydroxy naphthalene) (resin N) was obtained.

SYNTHETIC EXAMPLE 10

0.3 mol of trimethyl sililmethacrylate and 0.7 mol of gricidylmethacrylate was mixed with g of toluene. Then, azoisobuthylnitoril was added and heated at 70° C. for 8 hours. The product was prepicitated dropwise to acetone-methanol solution to obtain 3/7 copolymer of trimethylsilimethacrylate and gricidyl methacrylate (molecular weight: 10000)

After stirring the products in an acetone-acdic acid-water mixed solution for one hour to remove trimethylsiylil group protecting, and reprecipltaing it in water. After these treatments, the 3/7 copolymer of methacrylic acid and gricidyl methacrylate (resin O) was obtained.

In addition, a commercial products resin P: epoxy resin of 1,6-naphthalenediol (manufactured by DAINIHON INK Co., Ltd)

resin Q: epoxy resin of 4,4"-methlenebis (dihydroxylnaphthalene) (manufactured by DAINIHON INK Co., Ltd)

resin R: epoxy resin of 4,4-methylene-bis (dihydroxylnaphthalene) (manufactured by Aldric Co.)

resin S: cycro aliphatic epoxy resin (CY179 manufactured by Ciba Geigy Ltd.)

The following acid or alkali generating agent to be incorporated into a light-sensitive composition (l), (m), and (n), were prepared.

compound (l): triphenylsulfonium trifluoroate (manufactured by MIDORI CO., LTD)

compound (m): 2-(4-methoxynaphftyl)-4,6-bis (trichloromethyl)-1,3,5-triazine, (munufactured by MIDORI Co., LTD)

compound (n): nitrobenzylcycrohehxyl carbamate (munufactured by MIDORI Co., LTD)

With respect to preparation of light sensitive compositions (resists) the above-mentioned compounds were combined in accordance with the formulations as indicated in table 3 below to prepare light sensitive compositions 18 to 24. Precisely, ethyl cellosolve acetate was added to the components of the indicated formulation, in an amount of three times by weight of the solid content of the formulation and then stirred for 6 hours at room temperature, and the resulting mixture was filtered through a Teflon filter having a pore diameter of 0.2 μm to prepare a varnish of a light-sensitive composition.

TABLE 3

Formulation of light sensitive composition (resist)

| Composition No. | Acetal Resin Component (Wt. %) | Epoxy Resin Component (Wt. %) | Optical Acid or Alkali Generating Agent (Wt. %) |
|---|---|---|---|
| 18 | J(73) | M(25) | l(2) |
| 19 | K(75) | N(25) | l(1) |
| 20 | K(75) | N(20) | m(5) |
| 21 | K(75) | N(20) | n(5) |
| 22 | L(78) | P(20) | l(2) |
| 23 | K(49) | S(20), Q(30) | l(2) |
| 24 | O(74) | R(25) | l(1) |

Using the above-listed light-sensitive compositions, patterns were formed.

Each varnish of the light sensitive compositions Nos. 18 to 24 as shown in Table 3 above was coated on a 5-inch silicon wafer by spin-coating and then pre-baked on a hot plate at 110° C. for 5 minutes to form a light-sensitive layer (resist layer) having a thickness of 0.9 μm.

Next, the light-sensitive layer was patternwise-exposed to an ArF excimer laser ray (having a wavelength of 193 nm) by contact-exposure, and then baked on a hot plate of 110° C. for 2 minutes, subsequently, the wafer was dipped in the developer shown in Table 4 for 60 to 200 seconds to develop the light sensitive layer.

Further, the thus-developed wafer was washed with after and dried to form a desired patterns with lines and spaces.

Thus-faleicated patterns were observed with SEM to evaluate the resolution of them. The data of the sensitivity and the resolution (minimum width of lines which can be resolved) of the light-sensitive layer (formed with the light-sensitive composition) are shown in Table 4 with respect to the obtained patterns.

TABLE 4

Formulation of Patterns (Example 2)

| Composition No. | Sensitivity (mJ/(m²)) | Resolution (μm) | Developer |
|---|---|---|---|
| 18 | 15 | 0.5 | MIBK |
| 19 | 25 | 0.5 | 3.0% TMAH |
| 20 | 80 | 0.5 | 3.0% TMAH |
| 21 | 75 | 1.0 | 3.0% TMAH |
| 22 | 20 | 0.5 | MIBK |
| 23 | 10 | 0.5 | MIBK |
| 24 | 30 | 0.5 | 3.0% TMAH |

Condition: Contact-exposure with ArF excimer laser ray Post-exposure baking at 110° C. for 2 minutes
Thickness of light-sensitive layer: 0.9 m
Developer: TMAH (tetramathylammonium hydroxide) solution of the water MIBK (methylisobuthylketone)

Next, an absorbance at 193 nm of the light-sensitive layer (formed of the light-sensitive composition 18–24) having 1 μm thick were measured.

The data of the absorbance of the light-sensitive layer (formed with the light-sensitive composition) are shown in Table 5. On the other hand, an absorbance at 193 nm of the light-sensitive layer formed of the commercial photoresist OFPR-800 (Manufactured TOKYO OHKA Co., Ltd) having 1 μm thick were also measured as a comparative example. The data of the absorbance of the light-sensitive layer (formed with the light-sensitive composition) are shown in Table 5.

Using the pattern formed from light-sensitive compositions 18–24 and OFPR-800 as an etching-resistant mask, etching rates for reactive ion etching using $CF_4$, plasma (50 mTorr, 80 W) were measured. The data of the etching rate of the light-sensitive layer (formed of the light-sensitive composition 18–24 and OFPR-800) are shown in Table 5.

Using the pattern formed from light-sensitive compositions No.18–24 and OFPR-80 as an etching resistmasku, etching using $CF_4$, plasma (50 m Torr, 80 W) were measured. The data of the etcing rate of the light sensitive layer (formed of the light-sensitive composition No.18–24 and OFPR-800) are shown in Table-5.

TABLE 5

| Composition No. | Absorbance | Etching rate (nm/min) |
|---|---|---|
| 18 | 0.6 | 3.1 |
| 19 | 0.5 | 3.0 |
| 20 | 0.5 | 3.5 |
| 21 | 0.7 | 3.0 |
| 22 | 0.6 | 3.2 |
| 23 | 0.5 | 3.5 |
| 24 | 0.5 | 3.0 |
| OFPR-800 | 30.0 | 3.0 |

From the results, it is obvious that the pattern as formed in the examples of the present invention have very high tranceparency to ArF excimer laser compared relatively with OFPR-800, and also have enough high dry etching resistance, which are almost same as that for OFPR-800, enabling conventional LSI fabrications.

EXAMPLE 3

To the varnish of light-sensitive composition No.17 was added pyrene (compound of generating a fluorescent light) in an amount of 3% by weight of the solid content of the varnish, and the resulting mixture was again filtered to give light-sensitive composition No.25. Using Composition No.25, a pattern was formed in accordance with the same method and condition as in Example 1. As a developer, an aqueous 2.38% tetramethylammonium hydroxide solution was used.

Table 6 below shows the sensitivity and resolution of the light-sensitive layer Example 3 as well as the shape of the cross section of the pattern formed therein. It also shows the sensitivity and resolution (width of lines of pattern) of the light-sensitive layer made from Light-sensitive Composition No.17 of Example 1 along with the shape of the cross section of the pattern formed therein.

EXAMPLE 4

5% by weight of $MgWO_4$ powder (compound for generating a fluorescent light) and polyvinyl acrylate were mixed in water, and 1% of a surfactant. Epikote was added thereto.

The resulting dispersion was coated on a substrate and heated at 200° C. for 5 minutes to form a thin film of a fluorescent light-generating layer having a thickness of 0.1 μm on the substrate. A varnish of light-sensitive composition No.17 was coated over the layer by spin-coating. The thus-coated substrate was then exposed and developed in accordance with the same method and condition as in Example 1 to form a pattern thereon. As a developer, an aqueous 2.38% tetramethylammonium hydroxide solution was used.

The present example corresponds above described to the fourth method according to the present invention.

The sensitivity and resolution (width of lines of pattern) of the light-sensitive layer of the present example and also the shape of the cross section of the pattern formed therein are shown in Table 6 below.

TABLE 6

Formation of Patterns

| Test No. | Sensitivity (mJ/cm$^2$) | Resolution ($\mu$m) | Shape of Cross Section of Pattern |
|---|---|---|---|
| *1 | 150 | 0.5 |  |
| *2 | 120 | 0.4 | 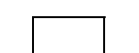 |
| *3 | 120 | 0.4 | 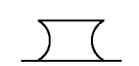 |

*Test 1: The pattern was formed using light-sensitive composition No. 17.
*Test 2: The pattern was formed using light-sensitive composition No. 24 (containing a compound of generating a fluorescent light).
*Test 3: The pattern was formed using light-sensitive composition No. 17 as coated over the fluorescent light-generating layer formed on the substrate.

EXAMPLE 5

A light-sensitive layer was formed on a substrate, using Light-sensitive composition No.17. Over the layer, the same dispersion of the fluorescent light-generating compound as used in Example 3 was coated and heated at a temperature of 200° C. for 5 minutes to form a thin film of a fluorescent light-generating layer having a thickness of 0.1 $\mu$m. Subsequently, the light-sensitive layer and the fluorescent light-generating layer were exposed to electron beams of 20 keV and then developed in accordance with the same method and condition as in Example 1 to form a pattern on the substrate.

In the present example, the sensitivity of the light-sensitive layer was 5 $\mu$C/cm$^2$ to form a pattern having a line width of 0.3 $\mu$m.

For comparison, wherein the light-sensitive layer was directly formed on the bas without forming the fluorescent light-generating layer thereon, no pattern was formed.

COMPARATIVE EXAMPLE

A comparative light-sensitive composition No.26 was prepared in the same manner as in preparation of light-sensitive composition No. 3, except that Resin B in the resin composition was replaced by polyvinylphenol (having a molecular weight of 6,000).

Using Composition No.26, a pattern was formed by exposure with an ArF excimer laser in accordance with the same method and condition as in Example 1. However, a satisfactory pattern could not be formed even by exposure of 500 mJ.

REFERENTIAL EXAMPLE

Using the pattern formed from light-sensitive composition No. 3 in Example 1 as an etching-resistant mask, active ion etching was effected with CF$_4$ plasma, whereupon the etching rate was 47 mm/min.

For comparison, a pattern was formed on a substrate, using a resist of polymethyl methacrylate (PUMA) in accordance with the same method and condition as in Example 1. Using the pattern thus-formed as an etching-resistant mask, active ion etching was also effected in the same manner as described above, whereupon the etching rate was 140 mm/min.

From the results, it is obvious that the patterns as formed in the examples of the present invention have a higher dry-etching resistance by about three times or more than the pattern formed from PUMA by ArF excimer laser exposure.

As explained in detail above, the present invention provides methods of forming patterns by short-wavelength light exposure. In accordance with the methods of the present invention, patterns having a high resolving power and an excellent dry-etching resistance are formed stably. The methods of the present invention can be applied effectively to lithography in the process of producing semiconductor devices and have excellent values in the industrial field.

While the invention has been description detail and with reference to specific embodiments thereof, it will be apparent to one skilled in the art that various change and modification can be made therein without departing from the spirit and scope thereof.

What we claim is:

1. A method of forming a pattern on a substrate comprising:
   a step of forming on the substrate a laminated layer comprising a light-sensitive layer and a fluorescent light-generating layer;
   a step of patternwise-exposing the laminated layer to at least one of electromagnetic radiation and an electron beam to generate a fluorescent light in the fluorescent light-generating layer causing a photo chemical reaction in the light-sensitive layer at least due to the action of the fluorescent light; and
   a step of developing the light sensitive layer.

2. A method of forming a pattern comprising:
   a step of forming a laminated layer comprising a light-sensitive layer and a fluorescent light-generating layer containing a fluorescent light-generating compound;
   a step of patternwise-exposing the laminated layer to a beam selected from the group consisting of electromagnetic radiation and an electron-beam causing photoreaction in the light-sensitive layer due to both fluorescent light generated by the fluorescent light-generating layer and the beam; and
   a step of developing the light sensitive layer.

3. The method of forming a pattern according to claim 2, wherein the light-sensitive layer is exposed by the beam through the fluorescent light-generating layer.

4. The method of forming a pattern according to claim 2, wherein the fluorescent light-generating layer is exposed by the beam through the light-sensitive layer.

5. The method of forming a pattern according to claim 2, wherein the fluorescent light-generating layer comprises a fluorescent light-generating compound comprising an aromatic compound containing an aromatic ring having 4 to 12 double bonds in conjugation.

6. The method of forming a pattern according to claim 5, wherein the aromatic compound comprises a polycyclic aromatic compound.

7. The method of forming a pattern according to claim 2, wherein the fluorescent light-generating compound comprises a fluorescent dye.

8. The method of forming a pattern according to claim 2, wherein the fluorescent light-generating compound comprises an inorganic fluorescent agent.

9. The method of forming a pattern according to claim 2, wherein the fluorescent light-generating compound comprises a binder polymer.

10. The method of forming a pattern according to claim 9, wherein the binder polymer is water soluble.

11. A method of forming a pattern on a substrate comprising:
- forming a light-sensitive layer including an aromatic compound which generates fluorescent light upon exposure to electromagnetic radiation and wherein the light-sensitive layer further comprises a fluorescent dye;
- patternwise-exposing the light-sensitive layer to the electromagnetic radiation to generate fluorescent light to cause a photochemical reaction in the light-sensitive layer due to both action of the electromagnetic radiation and fluorescent light; and
- developing the light-sensitive layer.

12. A method of forming a pattern on a substrate comprising:
- forming a light-sensitive layer including an aromatic compound which generates fluorescent light upon exposure to electromagnetic radiation;
- forming a fluorescent light-generating layer containing a compound generating fluorescent light by exposure;
- patternwise-exposing the light-sensitive layer to the electromagnetic radiation to generate fluorescent light to cause a photochemical reaction in the light-sensitive layer due to both action of the electromagnetic radiation and fluorescent light; and
- developing the light-sensitive layer.

* * * * *